United States Patent [19]
Jaffard et al.

[11] Patent Number: 5,508,656
[45] Date of Patent: Apr. 16, 1996

[54] AMPLIFIER WITH OFFSET CORRECTION

[75] Inventors: Jean-Luc Jaffard; Randolph Fox, both of Saint Egreve, France

[73] Assignee: SGS-Thomson Microelectronics S.A., Saint Genis Pouilly, France

[21] Appl. No.: 360,148

[22] Filed: Dec. 20, 1994

[30] Foreign Application Priority Data

Dec. 23, 1993 [FR] France ................................. 93 15943

[51] Int. Cl.⁶ ............................................... H03F 3/45
[52] U.S. Cl. ............................ 330/9; 330/259; 330/290; 360/67
[58] Field of Search ........................... 330/9, 97, 259, 330/290, 307; 360/67

[56] References Cited

U.S. PATENT DOCUMENTS

| | | | |
|---|---|---|---|
| 3,366,889 | 1/1968 | Avins | 330/290 |
| 3,580,243 | 5/1971 | Johnson | 128/2.06 B |
| 3,737,798 | 6/1973 | Faraguet et al. | 330/9 X |
| 4,039,963 | 8/1977 | Guillon et al. | 330/9 |
| 4,430,622 | 2/1984 | Simoes | 330/9 |
| 4,622,521 | 11/1986 | Redfern | 330/9 |

FOREIGN PATENT DOCUMENTS

| | | | |
|---|---|---|---|
| 2434538 | 4/1978 | France | H04N 9/537 |
| 4258005 | 9/1992 | Japan | 330/259 |
| 8802241 | 4/1990 | Netherlands | 330/259 |

OTHER PUBLICATIONS

Review of Scientific Instruments, vol. 59, No. 7, Jul. 1988, New York US, pp. 1241–1243, R. C. S. Freire et al., "DC Amplifier with Auto–Zeroing of Thermal Drift".

*Primary Examiner*—James B. Mullins
*Attorney, Agent, or Firm*—David M. Driscoll; James H. Morris; Richard F. Giunta

[57] ABSTRACT

A signal processing circuit that includes a differential amplifier and an integrator. The differential amplifier receives at a first input a signal to process and at a second input an offset compensation signal provided by the integrator. The integrator includes a differential transconductance amplifier receiving an output voltage of the signal processing circuit at a first input and a reference voltage at a second input; a capacitor having a first terminal connected to the output of the transconductance amplifier and a second terminal connected to a fixed voltage; and a voltage follower receiving the voltage at the first terminal of the capacitor and providing the offset compensation signal.

37 Claims, 2 Drawing Sheets

5,508,656

AMPLIFIER WITH OFFSET CORRECTION

BACKGROUND OF THE INVENTION

1. Field of the Invention

The present invention relates to an amplifier including a device for correcting or adjusting the output offset voltage of either the amplifier, or a processing circuit including the amplifier. The invention more particularly relates to an amplifier, such as a magnetic head amplifier, having an active state in which its output is taken into account by further circuits and an inactive state in which its output is ignored.

2. Discussion of the Related Art

When an AC signal must be processed (amplified, filtered, etc.), it is often necessary to eliminate, at one or several stages of the processing circuit, DC components which, if they become too high after successive amplifications, could cause a clipping of the processed signal. The DC components, or offset voltages, are particularly impairing in some applications, such as processing of signals provided by magnetic heads, in which they are very high compared to the effective AC component of the processed signal.

To eliminate a DC component, a capacitor is usually inserted in the path of the processed signal. However, if it is desired to pass low frequencies, as for example in sound processing, the values of the capacitors must be particularly high, which does not allow integration of the capacitors into a circuit. Furthermore, in a processing chain, it is often necessary to eliminate the DC components at several stages and therefore to insert a plurality of capacitors, thus requiring the provision of the same number of additional pins in the integrated circuit when the processing circuit is integrated.

FIG. 1 represents a conventional circuit using a single capacitor to eliminate the DC component, or to adjust the component at a desired value at the output of a processing chain, independently of the offset voltages added to the signal upstream.

In the example of FIG. 1, the processing chain includes an operational amplifier 10 followed by a filter 12 providing the output signal Vout of the processing chain. The elements of the circuit are supplied between a high voltage V+ and a low voltage V−, for example ground. The input signal Vin of the chain is provided at the noninverting input of amplifier 10. Amplifier 10 includes a feedback loop including a resistor R1 connected between its output and its inverting input, and a resistor R2 connected between the inverting input and a correction or compensation voltage Vc. The correction voltage Vc is provided through an integrator 14 which integrates the difference between the output voltage Vout and a reference voltage Vref.

In this configuration, the DC component of the output voltage Vout establishes at value Vref, independently of the elements found upstream the output Vout. Preferably, voltage Vout is selected at the average of the supply voltages V+ and V−, for example by a bridge of resistors R3 and R4 of equal value. Thus, the output voltage can have the same amplitude on both sides of its DC component Vref. An integrator 14 requires an integration capacitor CI that is generally connected between the output and the inverting input of an operational amplifier. If the processed signal is liable to have a low frequency (for example 10 Hz in sound processing), capacitor CI must have a high value to prevent the DC component of signal Vout from oscillating with the low frequency. Therefore, capacitor CI may be physically too large to be integrable, and thus two additional connection pins must be provided on a circuit integrating the processing circuits to connect to two terminals of an external capacitor CI.

SUMMARY OF THE INVENTION

An object of the present invention is to provide an integrated processing circuit with an improved offset voltage compensation loop.

The foregoing object is achieved in one illustrative embodiment of the present invention, in which a signal processing circuit is provided that includes a differential amplifier receiving at a first input a signal to process and at a second input an offset voltage compensation signal provided by an integrator. The integrator includes a differential transconductance amplifier receiving an output voltage of the signal processing circuit at a first input and a reference voltage at a second input; a capacitor having a first terminal connected to the output of the transconductance amplifier and a second terminal connected to a fixed voltage; and a voltage follower receiving the voltage at the first terminal of the capacitor and providing the offset compensation signal.

According to another embodiment of the present invention, the output of the signal processing circuit is taken into account during an active phase and ignored during an inactive phase. The signal processing circuit includes a first switch for connecting the first terminal of the capacitor to the output of the transconductance amplifier during the active phase, and for connecting the first terminal of the capacitor to the output of a reference voltage generator during the inactive phase.

According to a further embodiment of the present invention, the signal processing circuit includes a second switch for connecting the first and second inputs of the transconductance amplifier to the output signal and to the reference voltage, respectively, during the active phase, and for connecting the first and second inputs of the transconductance amplifier to the reference voltage and to the output of the voltage follower, respectively, at the beginning of the inactive phase, the switching of the first switch being delayed.

According to an additional embodiment of the present invention, the transconductance amplifier has two transconductances that can be selected by a control signal such that the highest transconductance is selected at the beginning of each mode transition of the processing circuit.

The foregoing and other objects, features, aspects and advantages of the invention will become apparent from the following detailed description of the present invention when taken in conjunction with the accompanying drawings.

DETAILED DESCRIPTION

Figure 1:
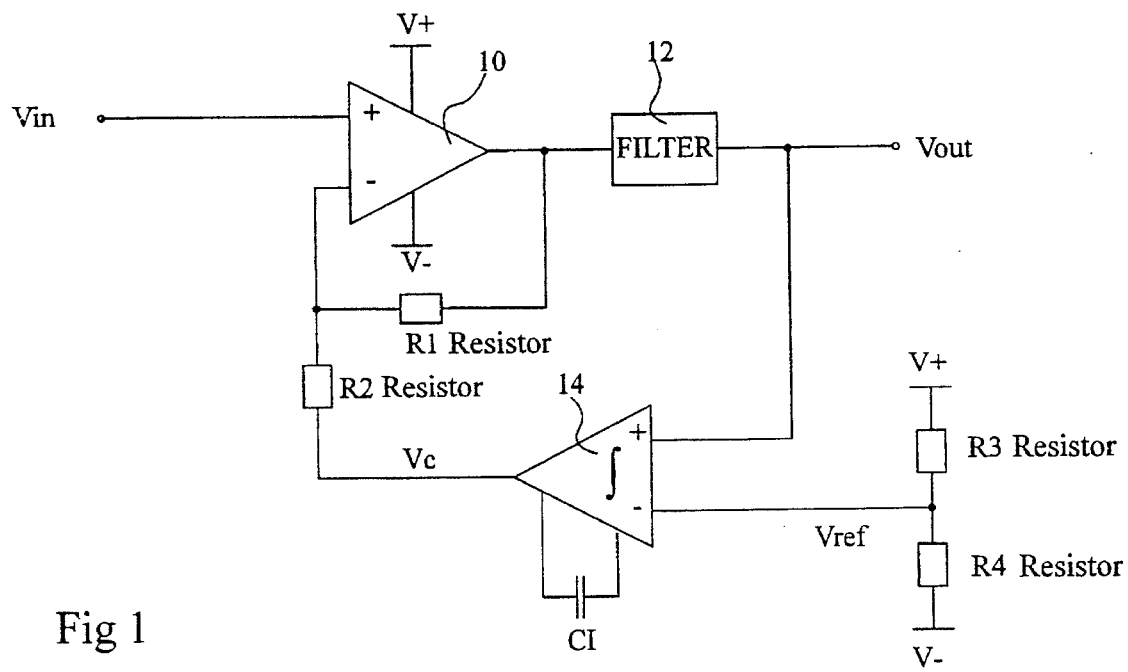
FIG. 1, above described, represents a conventional signal processing circuit including an offset compensation loop.
Figure 2:
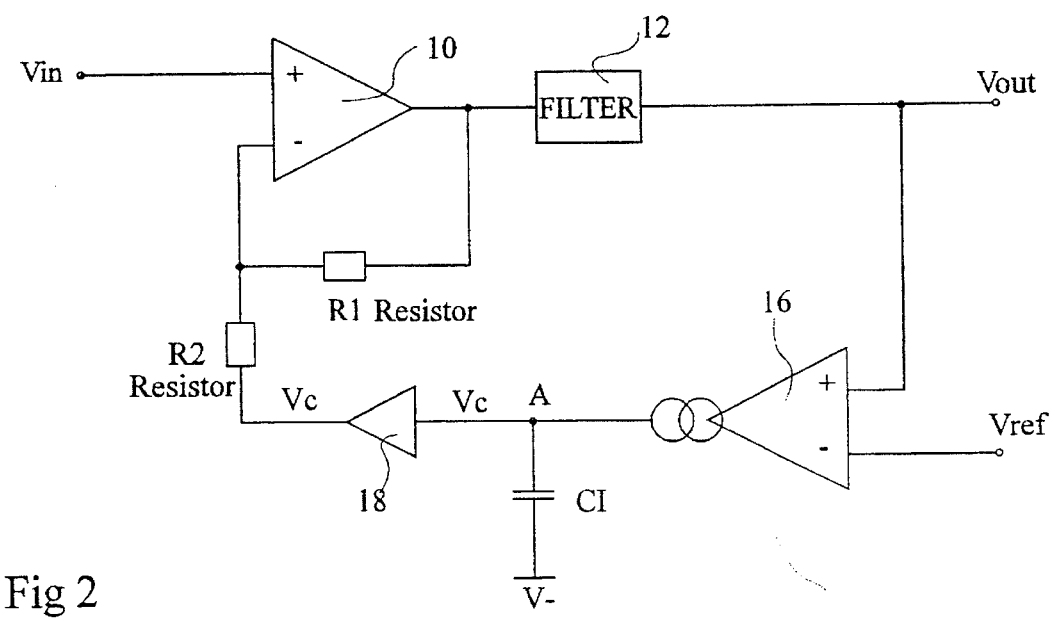
FIG. 2 represents a processing circuit including an embodiment of an offset compensation loop according to the invention.

FIG. 2 represents many of the same elements as in FIG. 1, labeled with same reference numerals. According to one embodiment of the invention, a particular structure of integrator 14 is selected. The integrator 16 includes a transconductance amplifier 16 receiving at its non-inverting input the output voltage Vout and receiving at its inverting input the reference voltage Vref. The transconductance amplifier 16 provides at a terminal A of an integration capacitor CI a current substantially proportional to the difference between its input voltages, Vout and Vref. The second terminal of capacitor CI is connected to a fixed voltage that is available outside the circuit if the latter is integrated, as for example the low supply voltage V−.

With this configuration, the greater the difference between voltages Vout and Vref, the faster capacitor CI is charged, which corresponds to an integration of this difference.

The voltage at terminal A of capacitor CI corresponds to the correction voltage Vc to be applied to resistor R2. However, to prevent the output current of the transconductance amplifier 16 from being loaded by resistor R2, and therefore not to impair the integration function, a voltage follower 18 is placed between resistor R2 and terminal A. In one embodiment, the transconductance amplifier 16 and the voltage follower 18 work together as a compensation amplifier that provides a compensation loop as described in more detail below. In such an embodiment, one input terminal of the compensation amplifier is the noninverting input of the transconductance amplifier 16, a second input terminal of the compensation amplifier is the inverting input of the transconductance amplifier 16, and a third input terminal of the compensation amplifier is the input of the voltage follower 18. The output of the compensation amplifier is the output of the voltage follower 18.

The result obtained with a compensation loop according to the invention is the same as that of the loop of FIG. 1. In contrast, one terminal of capacitor CI is not connected inside the integrated circuit; it is connected to a supply voltage (V− in the given example) that is available externally. Accordingly, only a single pin is needed to implement the integration capacitor CI in the integrated circuit.

Among the processing circuits that require offset compensation, there are circuits having two modes of operation, that is, an active mode during which the output of the processing circuit is effectively taken into account and an inactive mode during which the output of the processing circuit is ignored. This is in particular the case for magnetic head playback amplifiers in which, during a playback phase, the signal provided by the magnetic head is amplified and, during a record phase, the playback amplifier is not used.

In such a circuit, the present invention further uses the integration capacitor CI to filter, while the processing circuit is inactive, a reference voltage needed by further processing circuits which are then active.

Figure 3:
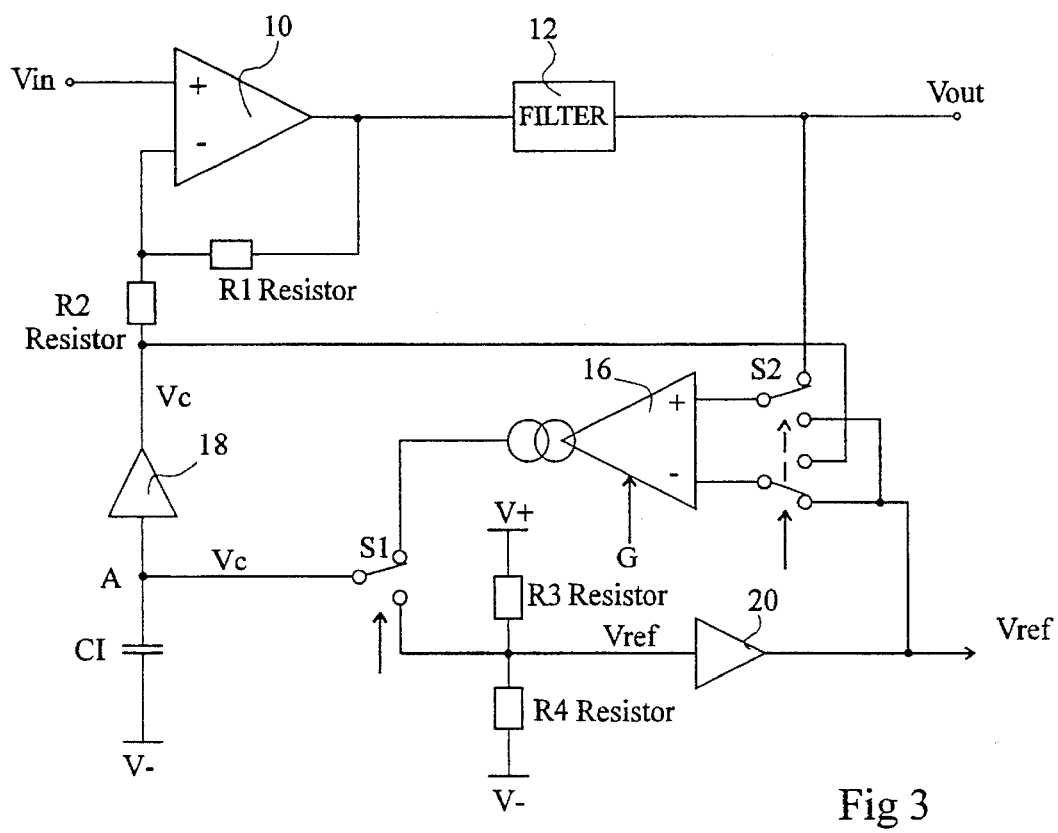
FIG. 3 represents a signal processing circuit having an active mode and an inactive mode, including an alternative offset compensation loop according to the invention.

FIG. 3 represents a circuit designed for obtaining this result according to one embodiment of the invention. When a magnetic head playback amplifier is used, the reference voltage Vref, to which the DC component of the output voltage Vout is to be adjusted, also serves as a reference voltage for circuits (not shown) designed to carry out recording. This reference voltage, obtained through a bridge of resistors R3, R4, followed by a voltage follower 20, is very noisy and should be filtered.

Conventionally, filtering is obtained by connecting the node between resistors R3 and R4 to one of the supply voltages through a high value capacitor that must obviously be connected externally to the integrated circuit.

An embodiment of the present invention provides to connect, through a switch S1, the terminal A of the integration capacitor CI to the node between resistors R3 and R4 during the inactive phase of the processing circuit. Thus, capacitor CI is used as an integration capacitor during the active phase and as a filtering capacitor for filtering the reference voltage during the inactive phase. Accordingly, a filtering capacitor and a pin to connect it to the integrated circuit are spared. This embodiment can be easily realized because one of the terminals of capacitor CI is constantly connected to the same node, V−.

Switch S1 can be controlled by a signal selecting the mode of the processing circuit, for example a signal PB/REC selecting the playback mode or the record mode in a tape recorder.

However, in one particular embodiment, during the active phase of the processing circuit, capacitor CI is loaded at a compensation voltage Vc that differs from the reference voltage Vref. This difference increases with the offset introduced by the processing circuit. Thus, if terminal A of capacitor CI is abruptly switched so as to be coupled to the resistor bridge R3, R4, the reference voltage Vref abruptly varies and progressively recovers its initial state. This abrupt variation would cause, in a tape recorder, the recording of a spurious pulse on the tape.

To avoid this drawback, one embodiment of the present invention provides a switch S2 which, during the inactive phase, connects the non-inverting input of the transconductance amplifier 16 to the reference voltage Vref and connects the inverting input to the output of the voltage follower 18. During the active phase, switch S2 establishes the connections shown in FIG. 2.

Figure 4:
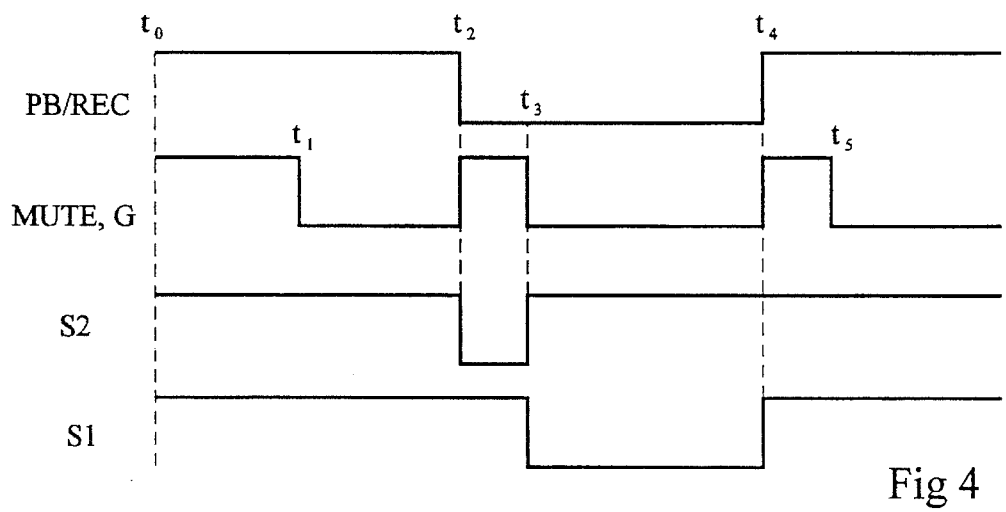
FIG. 4 is a timing diagram of various signals illustrating the operation of the offset compensation loop of FIG. 3.

FIG. 4 represents, in the example of a tape recorder, the waveforms of the control signals of switches S1 and S2 as a function of a signal PB/REC for selecting the mode of the processing circuit and of a signal MUTE that is conventionally used in a tape recorder to attenuate the parasitic effects when switching modes and powering on. Signal MUTE acts, for example, by forcing to 0 the outputs of the amplifiers likely to generate spurious pulses.

At time $t_0$, the circuit is powered. Signal MUTE is active in order to attenuate the parasitic effects caused by the powering on. Signal PB/REC is at 1 and selects the active mode of the circuit. The control signals S1 and S2 of switches S1 and S2 are at 1; switches S1 and S2 are in the positions represented in FIG. 3.

At time $t_1$, signal MUTE switches to 0, causing the circuit to normally operate in the active mode.

At time $t_2$, the processing circuit is set to its inactive mode by the switching to 0 of signal PB/REC. Signal MUTE is activated to attenuate the parasitic effects caused by the switching. Switch S2 is switched but switch S1 is not yet activated. The transconductance amplifier 16, receiving the reference voltage Vref and the voltage Vc on terminal A of capacitor CI, provides a current to capacitor CI to allow the lather to be charged to voltage Vref.

At time $t_3$, signal MUTE is deactivated. Capacitor CI had sufficient time to charge to value Vref. Switch S2 is set to its initial state. Switch S1 is switched to connect capacitor CI to the resistor bridge R3, R4. At time $t_3$, the voltage across the terminals of capacitor CI and at the output of the resistor bridge R3 and R4 are identical and no spurious pulse occurs.

At time $t_4$, signal PB/REC switches to 1 to select the active mode of the circuit. Switch S1 returns to its initial state and signal MUTE is activated until time $t_5$ to attenuate the parasitic effects caused by the switching.

According to an alternative embodiment of the invention, as represented in FIG. 3, the transconductance amplifier 16 receives a signal G allowing to select a low or a high transconductance. A low transconductance is selected in steady state to obtain a high time constant for charging capacitor CI, thus preventing the offset compensation loop from following the oscillations at the lowest frequency of the processed signal. In contrast, a high transconductance is selected when capacitor CI must be rapidly charged or discharged during mode transitions of the processing circuit.

FIG. 4 also represents the waveform of signal G, which is the waveform of signal MUTE. At time $t_2$, when the circuit switches from the active mode to the inactive mode, signal G is activated to select the high transconductance until time $t_3$. In this case, the voltage across capacitor CI rapidly reaches value Vref, before time $t_3$ when signal MUTE is deactivated.

Similarly, at time $t_4$, when the circuit switches from the inactive mode to the active mode, signal G is again activated until time $t_5$ so that the voltage across capacitor CI rapidly reaches the correction voltage Vc.

As represented between times $t_O$ and $t_1$(G=1), the high transconductance is also selected when powering the circuit.

Figure 5:
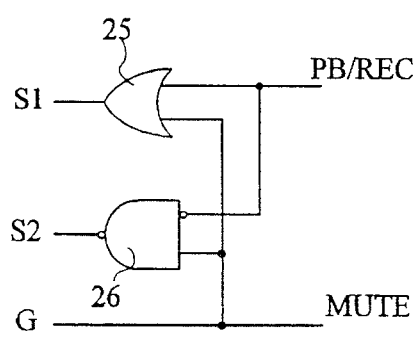
FIG. 5 represents an exemplary circuit for obtaining signals required by the circuit of FIG. 3.

FIG. 5 illustrates an exemplary circuit allowing to obtain signals S1, S2 and G from signals PB/REC and MUTE that are conventionally available in a tape recorder.

Signal G directly corresponds to signal MUTE.

Signal S1 is provided by an OR gate 25 receiving signals PB/REC and MUTE.

Signal S2 is provided by a NAND gate 26 receiving the complement of signal PB/REC and signal MUTE.

Having thus described particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to., be limiting. The invention is limited only as defined in the following claims and the equivalents thereto.

What is claimed is:

1. A signal processing circuit for processing an input signal and generating an output voltage, the signal processing circuit having an active phase and an inactive phase, the signal processing circuit comprising:

a differential amplifier having a first input that receives the input signal, and a second input that receives an offset compensation signal;

an integrator including;

a differential transconductance amplifier having a first input that receives the output voltage of the signal processing circuit, a second input that receives a first reference voltage, and an output;

a capacitor having a first terminal, and a second terminal connected to a second reference voltage; and a voltage follower having an input connected to the first terminal of the capacitor, and an output that provides the offset compensation signal to the second input of the differential amplifier; and a first switch that connects the first terminal of the capacitor to the output of the differential transconductance amplifier during the active phase and during the inactive phase, disconnects the first terminal of the capacitor from the output of the differential transconductance amplifier, and connects the first terminal of the capacitor to the first reference voltage, so that the output voltage is taken into account during the active phase and ignored during an inactive phase.

2. The signal processing circuit of claim 1, further including:

a second switch that;

during the inactive phase, disconnects the first input of the differential transconductance amplifier from the output voltage of the signal processing circuit, disconnects the second input of the differential transconductance amplifier from the first reference voltage, connects the first input of the differential transconductance amplifier to the first reference voltage, and connects the second input of the differential transconductance amplifier to the output of the voltage follower; and means for switching the second switch before the first switch switches during the inactive phase.

3. The signal processing circuit of claim 2, wherein the differential transconductance amplifier has two transconductances that can be selected by a control signal, such that a higher transconductance is selected during a part of the inactive phase.

4. The signal processing circuit of claim 2, wherein, during the inactive phase, the second switch disconnects the first input of the differential transconductance amplifier from the first reference voltage, disconnects the second input of the differential transconductance amplifier from the output of the voltage follower, connects the first input of the differential transconductance amplifier to the output voltage of the signal processing circuit, and connects the second input of the differential transconductance amplifier to the first reference voltage.

5. A circuit, connectable to a capacitor having a first terminal and a second terminal, for providing offset compensation for an alternating current signal when operating in a first mode, and for filtering a first reference voltage when operating in a second mode, the first terminal of the capacitor being coupled to a second reference voltage, the circuit comprising:

a differential amplifier having a first input terminal that receives the alternating current signal, a second input terminal, and an output terminal; and a compensation amplifier having a first input terminal coupled to the output terminal of the differential amplifier, a second input terminal that receives the first reference voltage, a third terminal connectable to the second terminal of the capacitor, and an output terminal coupled to the second input terminal of the differential amplifier, the compensation amplifier outputting at the third terminal a current indicative of a difference between the first reference voltage and a voltage at the output terminal of the differential amplifier when the circuit is operating in the first mode to provide offset compensation for the alternating current signal, the second input terminal and the third terminal of the compensation amplifier being coupled together when the circuit is operating in the second mode to filter the first reference voltage.

6. The circuit of claim 5, wherein the circuit is an integrated circuit.

7. The circuit of claim 5, further comprising a filter that couples the first input terminal of the compensation amplifier to the output terminal of the differential amplifier.

8. The circuit of claim 5, further comprising a resistor that couples the output terminal of the compensation amplifier to the second input terminal of the differential amplifier.

9. The circuit of claim 5, wherein the differential amplifier has a noninverting input and an inverting input, and wherein the first input terminal of the differential amplifier is the noninverting input, and the second input terminal of the differential amplifier is the inverting input.

10. The circuit of claim 5, wherein the compensation amplifier comprises:
   a transconductance amplifier with a noninverting input that comprises the first input terminal of the compensation amplifier, an inverting input that comprises the second input terminal of the compensation amplifier, and an output that is coupled to the third input terminal of the compensation amplifier; and
   a first voltage follower having an input coupled to the output of the transconductance amplifier and the third input terminal of the compensation amplifier, and an output that comprises the output terminal of the compensation amplifier.

11. The circuit of claim 10, wherein the circuit is an integrated circuit.

12. The circuit of claim 10, wherein the compensation amplifier further comprises a first switch, having a first and a second state, that:
   in the first state, couples the output of the transconductance amplifier to the third input terminal of the compensation amplifier; and
   in the second state, uncouples the output of the transconductance amplifier from the third input terminal of the compensation amplifier and couples the third input terminal of the compensation amplifier to the second input terminal of the compensation amplifier.

13. The circuit of claim 12, wherein the compensation amplifier further comprises a second switch having a first state corresponding to the first mode and a second state corresponding to the second mode, that:
   in the first state, connects the noninverting input of the transconductance amplifier to the first input terminal of the compensation amplifier, and connects and the inverting input of the transconductance amplifier to the second input terminal of the compensation amplifier; and
   in the second state, disconnects the noninverting input of the transconductance amplifier from the first input terminal of the compensation amplifier, disconnects the inverting input of the transconductance amplifier from the second input terminal of the compensation amplifier, connects the noninverting input of the transconductance amplifier to the second input terminal of the compensation amplifier, and connects the inverting input of the transconductance amplifier to the output terminal of the compensation amplifier.

14. The circuit of claim 13, wherein the transconductance amplifier has variable gain settings that include a high gain setting and a low gain setting.

15. The circuit of claim 14, wherein the transconductance amplifier is set to the high gain setting when the first switch is in the first state and the second switch is simultaneously in the second state.

16. The circuit of claim 15, wherein the transconductance amplifier is set to the low gain setting whenever the first switch is in the second state and whenever the second switch is in the first state.

17. The circuit of claim 15, in combination with a magnetic head playback amplifier having a playback mode corresponding to the first mode of the circuit, and a recording mode corresponding to the second mode of the circuit.

18. The circuit of claim 15, wherein the circuit is an integrated circuit.

19. A method of processing an alternating current electrical signal by a circuit, the circuit operating in either of a first mode and a second mode, the method comprising the steps of:
   A. generating an offset compensated signal that is proportional to a difference between the alternating current electrical signal and a compensation signal;
   B. generating a first current that is proportional to a difference between the offset compensated signal and a reference voltage;
   C. integrating the first current over time;
   D. generating the compensation signal to be proportional to the integration of the first current over time;
   E. when the circuit is operating in the first mode, enabling performance of steps A–D; and
   F. when the circuit is operating in the second mode, inhibiting performance of steps A–D and performing a step of generating a filtered reference voltage by filtering the reference voltage.

20. The method of claim 19, wherein:
   the step C of integrating the first current includes providing the first current to a capacitor; and
   the step F of generating includes filtering the reference voltage by connecting the capacitor to a source of the reference voltage.

21. A method of processing an alternating current electrical signal by a circuit, the circuit operating in either of a first mode and a second mode, the method comprising the steps of:
   A. generating an offset compensated signal that is proportional to a difference between the alternating current electrical signal and a compensation signal;
   B. generating a first current that is proportional to a difference between the offset compensated signal and a reference voltage;
   C. integrating the first current over time; and
   D. generating the compensation signal to be proportional to the integration of the first current over time;
   wherein:
   when the circuit is operating in the first mode, step B includes generating the first current to be proportional to a first constant multiplied by the difference between the offset compensated signal and the reference voltage; and
   when the circuit is operating in the second mode, step B includes generating the first current to be proportional to a second constant multiplied by the difference between the offset compensated signal and the reference voltage, the second constant being greater than the first constant.

22. The method of claim 21, wherein:
   when the circuit is operating in the first mode, the circuit performs a step of outputting the offset compensated signal as an output signal of the circuit; and
   when the circuit is operating in the second mode, the circuit performs a step of smoothly transitioning the output signal to a filtered reference voltage.

23. An apparatus, operable in either of a first mode and a second mode, for processing an alternating current electrical signal, the apparatus comprising:

first means for generating an offset compensated signal that is proportional to a difference between the alternating current electrical signal and a compensation signal when the apparatus is operating in the first mode;

second means for generating a first current that is proportional to a difference between the offset compensated signal and a reference voltage when the apparatus is operating in the first mode;

third means for integrating the first current over time when the apparatus is operating in the first mode;

fourth means for generating the compensation signal to be proportional to the integration of the first current over time when the apparatus is operating in the first mode; and fifth means for filtering the reference voltage when the apparatus is operating in the second mode.

24. The apparatus of claim 23, wherein:

the third means includes means for providing the first current to a capacitor; and the seventh means includes means for filtering the reference voltage by connecting the capacitor to a source of the reference voltage.

25. A method for enabling an integrated circuit to perform offset compensation of an input signal when operating in a first mode and to filter a first reference voltage when operating in a second mode, wherein the integrated circuit has only a single pin dedicated for connection to a capacitor, the method comprising the steps of:

A. providing the integrated circuit with a differential transconductance amplifier to generate an offset compensation voltage of the input signal;

B. connecting the capacitor between the single pin and a second reference voltage;

C. coupling the output of the differential transconductance amplifier to the single pin when the integrated circuit is operating in the first mode; and D. decoupling the output of the differential transconductance amplifier from the single pin and coupling the single pin to the first reference voltage when the integrated circuit is operating in the second mode.

26. The method of claim 25, wherein the transconductance amplifier has at least two gain settings, so that step A includes providing the integrated circuit with the differential transconductance amplifier having at least two gain settings.

27. An integrated circuit for performing offset compensation of an input signal with an external integration capacitor that is disposed outside the integrated circuit, the integrated circuit comprising:

a single pin dedicated for connection to the external integration capacitor;

a differential transconductance amplifier having a first input coupled to a reference voltage, a second input coupled to the input signal, and an output; and a switch, having a first state and a second state, the switch being constructed and arranged so that;

when the switch is in the first state, the output of the transconductance amplifier is coupled to the single pin dedicated for connection to the integration capacitor, so that the integrated circuit generates an offset compensation voltage for the input signal; and when the switch is in the second state, the reference voltage is coupled to the single pin, so that the integrated circuit generates a filtered reference voltage when the single pin is connected to the external integration capacitor.

28. The integrated circuit of claim 27, wherein the differential transconductance amplifier has at least two gain settings, the integrated circuit further comprising:

means for selecting either of the at least two gain settings.

29. The integrated circuit of claim 27, further comprising a second switch, the second switch having a first state and a second state, the second switch being constructed and arranged so that when the second switch is in the first state, the first input of the transconductance amplifier is coupled to the reference voltage and the second input of the transconductance amplifier is coupled to the input signal, and when the second switch is in the second state, the first input of the transconductance amplifier is coupled to the reference voltage and the second input of the transconductance amplifier is coupled to the single pin.

30. An integrated circuit for performing offset compensation of an input signal with an external integration capacitor that is disposed outside the integrated circuit, the integrated circuit having a first mode and a second mode, the integrated circuit comprising:

a single pin dedicated for connection to the external integration capacitor;

a differential transconductance amplifier having a first input coupled to a reference voltage, a second input coupled to the input signal, and an output;

means, when the integrated circuit is in the first mode, for coupling the first input of the transconductance amplifier to a reference voltage, for coupling the second input of the transconductance amplifier to the input signal, and for coupling the output of the transconductance amplifier to the single pin dedicated for connection to the integration capacitor, so that the integrated circuit generates an offset compensation voltage for the input signal; and means, when the circuit is in the second mode, for coupling the reference voltage to the single pin and inhibiting the differential transconductance amplifier from generating the offset compensation voltage, so that the integrated circuit generates a filtered reference voltage when the single pin is connected to the external integration capacitor.

31. The integrated circuit of claim 30, wherein the differential transconductance amplifier has at least two gain settings, the integrated circuit further comprising:

means for selecting either of the at least two gain settings.

32. A circuit, operable in a first mode and a second mode, for processing an alternating current electrical signal, the circuit comprising:

first means for generating an offset compensated signal that is proportional to a difference between the alternating current electrical signal and a compensation signal;

second means for generating a first current that is proportional to a difference between the offset compensated signal and a reference voltage;

third means for integrating the first current over time; and fourth means for generating the compensation signal to be proportional to the integration of the first current over time;

wherein the second means includes means for generating the first current to be proportional to a first constant multiplied by the difference between the offset compensated signal and the reference voltage when the circuit is operating in the first mode, and means for generating the first current to be proportional to a second constant multiplied by the difference between the offset compensated signal and the reference voltage when the circuit is operating in the second mode, the second constant being different than the first constant.

33. The circuit of claim 32, further comprising:

means for outputting the offset compensated signal as an output signal of the circuit when the circuit is operating in the first mode; and means for transitioning the output signal to a filtered reference voltage when the circuit is operating in the second mode.

34. A method for operating a circuit in a first mode and a second mode, the circuit including a capacitor, a transconductance amplifier, and first and second reference voltages, the method comprising the steps of:

(A) connecting a first terminal of the capacitor to an output of the transconductance amplifier and a second terminal of the capacitor to the second reference voltage, so that the capacitor integrates a current supplied by the output of the transconductance amplifier when the circuit is operating in the first mode; and (B) disconnecting the first terminal of the capacitor from the output of the transconductance amplifier and connecting the first terminal of the capacitor to the first reference voltage so that the capacitor filters the first reference voltage when the circuit is operating in the second mode.

35. The method of claim 34, wherein the first mode includes a first phase and a second phase, and wherein the step A of connecting includes the steps of:

coupling a first input of the transconductance amplifier to an input signal and coupling a second input of the transconductance amplifier to the reference voltage during the first phase;

decoupling the first input of the transconductance amplifier from the input signal and decoupling the second input of the transconductance amplifier from the reference voltage during the second phase; and coupling the first input of the transconductance amplifier to the reference voltage and coupling the second input of the transconductance amplifier to the capacitor during the second phase, so that a voltage at the capacitor smoothly transitions to the reference voltage during the second phase.

36. A circuit that is operable in a first mode and a second mode for use with a transconductance amplifier having an output and a capacitor having a first terminal connected to a first reference voltage and a second terminal, the circuit comprising:

means for connecting the second terminal of the capacitor to the output of the transconductance amplifier so that the capacitor integrates a current supplied by the output of the transconductance amplifier when the circuit is operating in the first mode; and means for disconnecting the second terminal of the capacitor from the output of the transconductance amplifier and for connecting the second terminal of the capacitor to a second reference voltage so that the capacitor filters the second reference voltage when the circuit is operating in the second mode.

37. The apparatus of claim 36, wherein the first mode includes a first phase and a second phase, and wherein the means for connecting includes:

means for coupling a first input of the transconductance amplifier to an input signal and coupling a second input of the transconductance amplifier to the second reference voltage during the first phase;

means for decoupling the first input of the transconductance amplifier from the input signal and decoupling the second input of the transconductance amplifier from the second reference voltage during the second phase; and means for coupling the first input of the transconductance amplifier to the second reference voltage and for coupling the second input of the transconductance amplifier to the capacitor during the second phase, so that a voltage at the capacitor smoothly transitions to the second reference voltage during the second phase.

* * * * *